United States Patent [19]
Ke

[11] Patent Number: 6,094,097
[45] Date of Patent: Jul. 25, 2000

[54] PROGRAMMABLE RF POWER COMBINER

[75] Inventor: Meng-Kun Ke, PineBrook, N.J.

[73] Assignee: Lucent Technologies, Inc., Murray Hill, N.J.

[21] Appl. No.: 09/132,339

[22] Filed: Aug. 11, 1998

[51] Int. Cl.[7] .................................................. H03F 3/68
[52] U.S. Cl. ..................................... 330/124 R; 330/295
[58] Field of Search ............................... 330/124 R, 295, 330/286, 51, 54

[56] References Cited

U.S. PATENT DOCUMENTS

| | | | |
|---|---|---|---|
| 4,439,740 | 3/1984 | Harrington | 330/124 R |
| 4,825,172 | 4/1989 | Thompson | 330/124 R |
| 4,831,619 | 5/1989 | Rosen | 330/124 R |
| 4,868,886 | 9/1989 | Assal et al. | 455/12 |
| 5,256,987 | 10/1993 | Kibayashi et al. | 330/295 |
| 5,287,543 | 2/1994 | Wolkstein | 330/124 R |
| 5,304,943 | 4/1994 | Koontz | 330/124 R |
| 5,610,556 | 3/1997 | Rubin | 330/124 R |
| 5,781,066 | 7/1998 | Parisi et al. | 330/124 R |
| 5,867,060 | 2/1999 | Burkett, Jr. et al. | 330/124 D |
| 5,884,143 | 3/1999 | Wolkstein et al. | 455/126 |

*Primary Examiner*—Robert Pascal
*Assistant Examiner*—Khanh Van Nguyen

[57] ABSTRACT

A programmable combiner including a first terminal providing a radio frequency input signal, a second terminal providing a radio frequency output signal, a plurality of linear amplifiers in connection therebetween, and switch means coupling individual ones of the plurality of amplifiers in series connection between the first and second terminals in providing a redundancy of continuing circuit operation upon the failure of any one or more amplifiers, and in providing a controllable level of output signal at the second terminal as gain characteristics of one or more of the amplifiers vary, or as different output power signal levels are required.

13 Claims, 2 Drawing Sheets

PROGRAMMABLE RF POWER COMBINER

BACKGROUND OF THE INVENTION

1. Field of the Invention

This invention relates to amplifier apparatus and, more particularly, to power amplifier output apparatus operating at radio frequencies.

2. Description of the Related Art

The advantages which follow from designing redundancy into electrically operating circuits are well acknowledged— even if only to add backup to an output power amplifier, for example, should failure occur. Similarly, the advantages which follow from controlling dc power as a means of conserving energy beyond that which is needed are understood as well. As will be appreciated, these features are desirable not only in such utilizations as concern satellite communication, for example, but apply equally as well in cellular arid related microwave system communications.

SUMMARY OF THE INVENTION

As will become clear from the following description, the present invention achieves these objectives of redundancy and dc control in a single, programmable power combiner construction. More specifically, in one embodiment of the combiner of the invention, a first terminal is included to provide a radio frequency (RF) input signal, a second terminal is included to provide a radio frequency output signal, a plurality of linear amplifiers are connected between the two terminals, and switch means are included to couple individual ones of the plurality of linear amplifiers in series circuit connection between the terminals in providing a redundancy of continuing circuit operation upon the failure of any one or more of the linear amplifiers—while at the same time, providing a controllable level of output signal at the second terminal as the gain characteristics of one or more of the amplifiers vary, or as different output power signal levels are required.

As will be seen, in implementing the combiner of the invention, an input section, an output section, and n linear amplifiers are employed, with n being a whole integer of 2 or more. In a preferred embodiment, the input section of the combiner includes one n-way RF signal splitter, n first impedance matching circuits coupled to individual outputs of the splitter in providing a series of decreasing impedance ratios of the order of 1:1, 1:2, . . . 1:n, n first switching circuits coupling into an input terminal of respective ones of the n amplifiers, and n−1 second switching circuits coupled between associated ones of the first impedance matching circuits and the first switching circuits. In this preferred embodiment, the output section includes one n-way RF signal combiner, n second impedance matching circuits coupled to individual inputs of the combiner in providing a series of increasing impedance ratios of the order of 1:1, 2:1, . . . n:1, n third switching circuits coupling into an output terminal of respective ones of the n amplifiers, and n−1 fourth switching circuits coupled between associated ones of the second impedance matching circuits and the third switching circuits. A plurality of RF links couple between selected ones of the first and second switching circuits, and between selected ones of the third and fourth switching circuits—and means are provided in accordance with the invention to control the positioning of the switching circuits according to a plan of adding redundancy in the presence of amplifier failure and in increasing or decreasing the power level output where needed.

Two constructions of the preferred embodiment of theinvention are disclosed. In the first construction, three linear amplifiers are employed (i.e., n=3), whereas in the second construction, four linear amplifiers are employed (i.e., n=4). With each, monitoring equipment—such as at a communications Base Station or at a mobile station where conserving battery power is important—detect the operating conditions of the amplifiers employed, and control the positioning of the various switching circuits to connect individual ones of the plurality of RF links to redirect RF signal flow to other impedance matching circuits and amplifiers in the event of the failure of any one or more of the amplifiers employed. There, where the amplifier circuits are of substantially the same gain characteristic, the switch positioning operates to control the amplifier apparatus in either increasing or decreasing power output level depending upon system needs. Where the amplifiers are of differing gain characteristic, on the other hand, the switching circuits are controllable in activating the various RF Links to alter signal flow in optimizing the RF power output delivered in matching the gain characteristics of those amplifiers in operation. In either arrangement, the result achievable will be appreciated to be an ability to maintain operation unaffected in the event of amplifier failure, while allowing controlled modification of amplifier power output based on the then required needs and conserving power wherever appropriate.

BRIEF DESCRIPTION OF THE DRAWINGS

These and other features of the present invention will be more clearly understood from a consideration of the following, taken in connection with the accompanying drawings, in which.

DETAILED DESCRIPTION OF THE INVENTION

Figure 1:
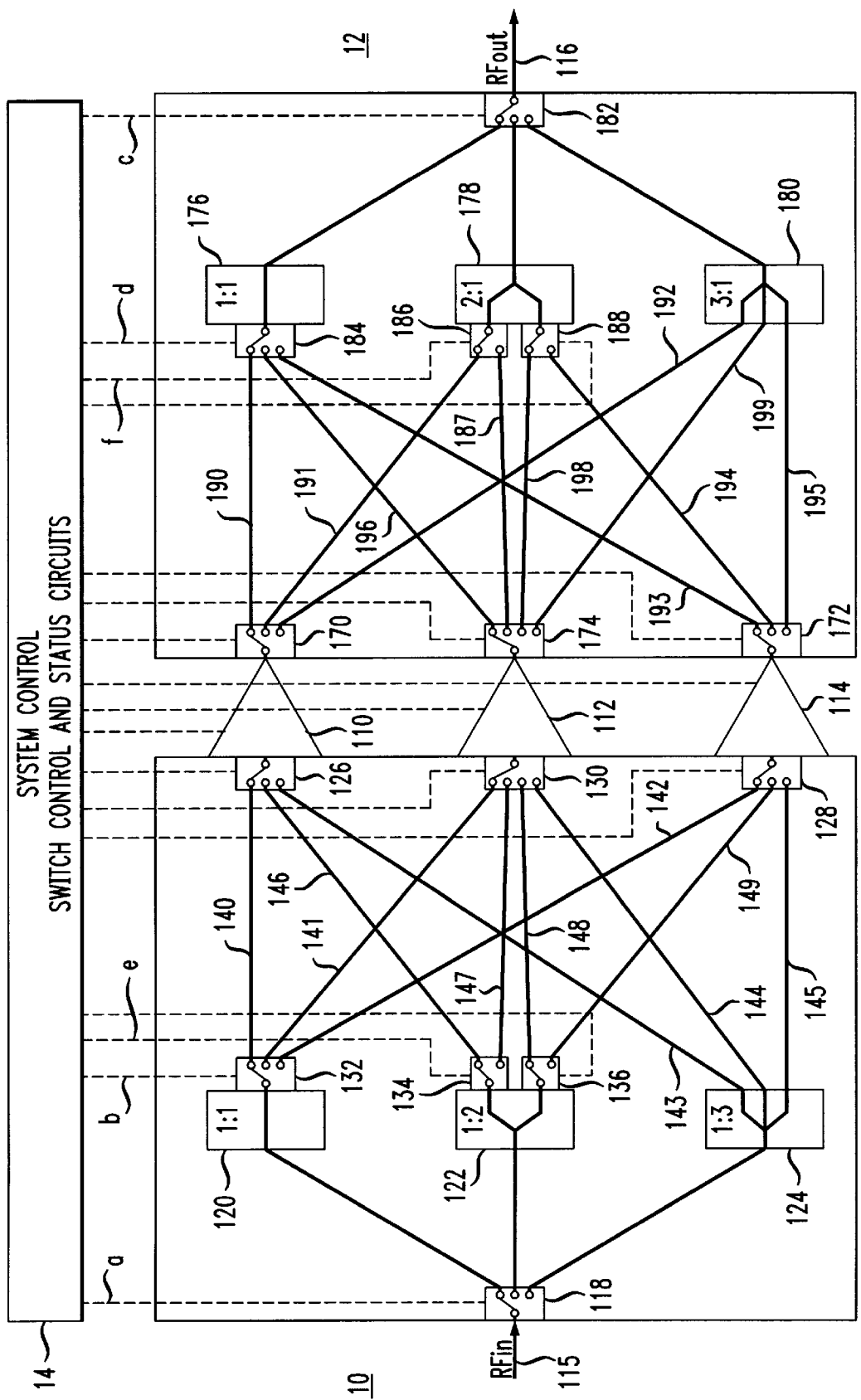
FIG. 1 is a block diagram of the programmable power combiner of the invention operative with three linear amplifiers.

In the construction of FIG. 1, n=3, with the linear amplifiers identified by the reference numerals 110, 112 and 114. In the input section 10, an RF signal at 115 is coupled to the input of a 3-way splitter 118, the outputs of which are respectively coupled to one of three impedance matching circuits 120, 122, 124 of decreasing impedance ratio of the order of 1:1, 1:2 and 1:3. Each of the amplifiers 110, 112, 114 is provided with a first switching circuit at their respective inputs, with the amplifiers 110 and 114 being provided with 3-way switching circuits 126 and 128, and with the amplifier 112 being provided with a 4-way switching circuit 130. Each of the impedance matching circuits 120, 122 is also provided with a second switching circuit, the impedance matching circuit 120 being provided with a 3-way switching circuit 132 and the impedance matching circuit 122 being provided with a pair of 2-way switching circuits 134, 136. As shown, the impedance matching circuit 124 is devoid of any switching circuit connection. Lastly: RF links 140, 141, 142 couple the output of switching circuit 132 to individual inputs of the switching circuits 126, 130 and 128; RF links 143, 144, 145 couple the outputs of the impedance matching circuit 124 to other individual inputs of the switching circuits 126, 130 and 128; RF links 146 and 147 couple the two outputs of the switching circuit 134 to other inputs of the switching 126 and 130, respectively; and RF links 148, 149 couple the two outputs of the switching circuit 136 to the two further inputs of the switching circuits 130 and 128.

In the output, recombining section 12 of FIG. 1, each of the amplifiers 110, 112 and 114 is provided with a third switching circuit at their respective outputs, with the amplifiers 110 and 114 being provided with 3-way switching circuits 170 and 172, and with the amplifier 112 being provided with a 4-way switching circuit 174. Impedance matching circuits 176, 178, 180 are included of increasing impedance ratios of the order of 1:1, 2:1 and 3:1, the outputs of which are respectively coupled to an input of a 3-way combiner 182, whose output signal is provided at 116. As also shown, the impedance matching circuit 180 is devoid of any switching connection, while each of the impedance matching networks 176 and 178 is further provided with a fourth switching circuit, the impedance matching circuit 176 being provided with a 3-way switching circuit 184 and the impedance matching circuit 178 being provided with a pair of 2-way switching circuits 186, 188. Lastly: RF links 190, 191, 192 couple the outputs of switching circuit 170 to individual inputs of the switching circuits 184 and 186 and to a first input of the impedance matching circuit 180; RF links 193, 194, 195 couple the output of switching circuit 172 to inputs of the switching circuits 184 and 188, and to a second input of the impedance matching circuit 180; RF links 196, 197, 198, 199 couple the outputs of the switching circuit 174 to inputs of the switching circuits 184, 186 and 188 respectively, and to a third input of the impedance matching circuit 180.

As will be noted, the output, combiner section 12 of FIG. 1 is essentially the reverse configuration of the input, splitter section 10.

Also shown in FIG. 1, and by the block 14, is a system control unit 14 for controlling the status of the switching circuits, the splitter and the re-combiner of FIG. 1 based upon a detection of the various operating conditions of the amplifiers 110, 112, 114—to essentially switch, in accordance with the invention, different ones of the switching circuits and impedance matching circuits into operation depending upon the operating conditions of the amplifiers—whether or not they are functioning, and whether or not the power output should be increased or decreased depending upon performance requirements at any instant of time. Such control functions will be understood to be effected by the various indicated links a, b, c, d, e, f, etc.

In use, if only linear amplifier 110 is to be operational, the switch control from the system control unit 14 adjusts the splitter 118 via the link "a" and the combiner 182 via the link "c" to the uppermost position, as shown, similarly controlling upwardly the switching circuits 132, 126, 170 and 184. Upon detection of a failure of amplifier 110, switching circuit 132 could be controlled to the mid-position illustrated, to bring amplifier 112 into operation, with switching circuit 184 being similarly controlled to its mid-position. If amplifier 112 was not operating either, switching circuit 132 could be controlled to its lowermost position under direction from the system control unit 14, to bring amplifier 114 into play, with the system control unit 14 similarly operating to control the switching circuit 184 to its lowermost position as well. Redundancy of operation thus follows.

Likewise, where reduced output power is desired, the switch controls from the system control unit 14 could control the input splitter 118 (and correspondingly the output re-combiner 182) to the mid-position, or lower-position, with other controls of the switching circuits being directed through the system control unit 14 to obtain the power level desired as an output, and with the availability of redundancy in those situations as well. For example, with the input splitter 118 in its mid-position, depending upon the switch controls from the system control unit 14, either amplifier 110 would be the only one operational, or only amplifier 112, or only amplifier 113, or different combinations of them depending upon system needs. As will be appreciated, such controls as effected in the input, splitting section 10 would be duplicated in the output, re-combining section 12 in obtaining the ultimate signal available for application to a transmitting antenna, for example—dependent upon the amplifier gain characteristics, whether they be the same or different, and through appropriate adjustment of various dc control levels.

Analyzing the operational needs for the 3-amplifier programmable combiner of FIG. 1, then, it will be noted that the input, splitter section 10 includes one 3-way splitter 118 at the input, three impedance matching circuits 120, 122 and 124, three 3-way input switches 126, 128, 132, two 2-way input switches 134, 136, and one 4-way input switch 130; similarly, the output, re-combiner section 112 includes three reverse impedance matching circuits 176, 178, 180, three 3-way output switches 170, 172, 184, two 2-way output switches 186, 188, one 4-way output switch 174, and one 3-way re-combiner 182 at the output.

Figure 2:
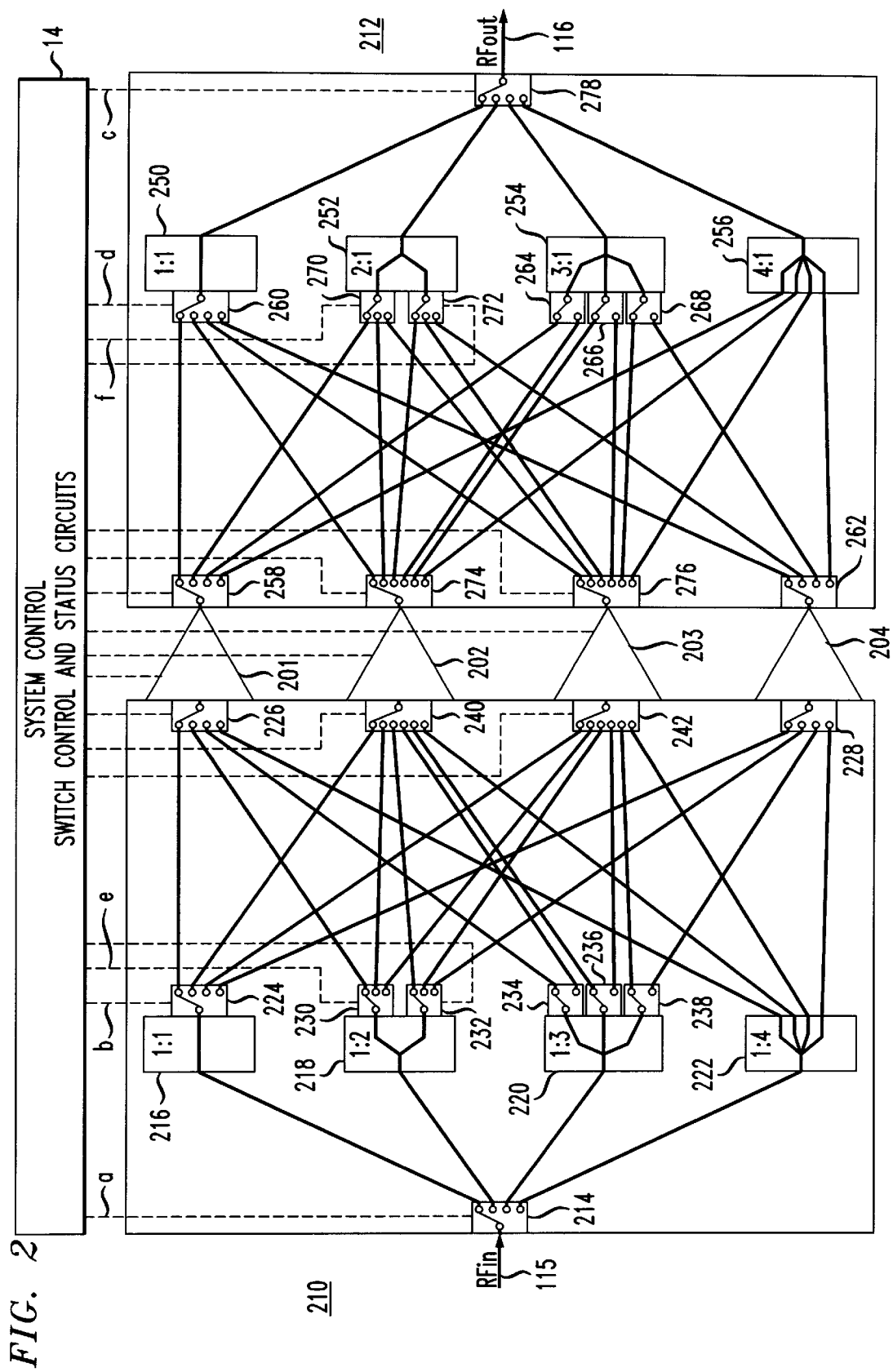
FIG. 2 is a block diagram of the combiner of the invention operative with four amplifiers.

In the construction of FIG. 2, on the other hand, n=4, with the linear amplifiers identified by the reference numerals 201, 202, 203 and 204. With the four amplifier construction, the following arrangement will be seen to be required for the input, splitter section 210 and for the output re-combiner 212. Thus, in the input, splitter section 210: one 4-way splitter 214, four impedance matching circuits 216, 218, 220, 222 of decreasing impedance ratios of the order of 1:1, 1:2, 1:3 and 1:4, three 4-way input switches 224, 226, 228, two 3-way input switches 230, 232, three 2-way input switches 234, 236, 238 and two 6-way switches 240, 242. In similar fashion, the output, re-combiner section 212 includes four reverse impedance matching circuits 250, 252, 254, 256 of increasing impedance ratios of the order of 1:1, 2:1, 3:1 and 4:1 respectively, three 4-way output switches 258, 260, 262, three 2-way output switches 264, 266, 268, two 3-way switches 270, 272, two 6-way switches 274, 276, and one 4-way re-combiner 278. As with the construction of FIG. 1, the system control unit 14 controls the positioning of the switching circuits, the splitter and the re-combiner depending upon the detected condition of the amplifier operation and requirement needs, to bring various ones of the amplifiers 201, 202, 203 and 204 into operation, and by varying amounts to effect back-up operation in the event of amplifier failure in providing redundancy, or in providing a controllable level of output signal as the gain characteristics of the amplifiers vary or as different output power signal level requirements are needed. The various RF links to accomplish this are as illustrated in FIG. 2, both in coupling the various switching circuits, impedance matching circuits, and amplifiers, and in controlling those circuits by the system control unit 14. Changing the impedance ratios in this manner (and/or the amplifiers used) varies the output signal level and dc power consumed—while changing the switching circuits brings alternate amplifiers into play in providing redundancy in the event of amplifier failure, as well as allowing signal level and dc power to be controlled continuously.

With the programmable power combiner of the invention, then, an RF signal at input terminal 115 can be applied through any one amplifier to the output terminal 116, or can be applied through any two or more amplifiers, and with any combination of those two or more amplifiers, all under the control of the switching system control unit 14 detecting the operating conditions present—at a Base Station or mobile station of a communications system, for example. Redundancy is controllable in this manner, as is the ability to achieve certain power outputs depending upon system needs at any given instant of time. Thus, if one amplifier should fail, a second (or a second and third, etc.) could be added in its place, and yet another one added if still more output power is required. In this environment, furthermore, the amplifiers could all have the same gain characteristics, or different gain characteristics.

Where it is desired to apply the entire RF input signal to the top amplifier in either of the FIGS. 1 and 2 constructions, the 1:1 impedance matching circuit is employed. If the entire RF input signal is to be applied to the adjacent amplifier in FIGS. 1 and 2, then the next lower switch positions of the splitter, the re-combiner and the various switching circuits are used, with the 1:2 impedance matching circuit on the input, and the 2:1 impedance matching circuit on the output. Where it is desired to add (or decrease) the output power, the system control unit 14 then simply adjusts the orientation of the splitter and the re-combiner, and the positions of the switching circuits, until the desired result is achieved at the output 116. In these and other situations, the ultimate arrangement determined is programmable in accordance with the monitoring and operation of the system control unit 14, incorporated as part of a system console, for example.

While there have been described what are considered to be preferred embodiments of the present invention, it will be readily appreciated by those skilled in the art that modifications can be made without departing from the scope of the teachings herein. For at least such reason, therefore, resort should be had to the claims appended hereto for a true understanding of the scope of the invention.

I claim:

1. A programmable radio frequency (RF) power combiner comprising:

an input section, an output section and n linear amplifiers therebetween;

with each input section including one n-way RF signal splitter, n first impedance matching circuits coupled to individual outputs of said splitter in providing a series of decreasing impedance ratios of the order 1:1, 1:2 . . . 1:n, n first switching circuits coupling into an input terminal of respective ones of said n amplifiers, and n−1 second switching circuits coupled between associated ones of said first impedance matching circuits and said first switching circuits;

with each output section including one n-way RF signal combiner, n second impedance matching circuits coupled to individual inputs of said combiner in providing a series of increasing impedance ratios of the order of 1:1, 2:1 . . . n:1, n third switching circuits coupling into an output terminal of respective ones of said n amplifiers, and n−1 fourth switching circuits coupled between associated ones of said second impedance matching circuits and said third switching circuits;

with n being a whole integer 2 or greater;

a plurality of RF links between selected ones of said first and second switching circuits, and between selected ones of said third and fourth switching circuits; and means controlling the conductivity condition of said first, second, third and fourth switching circuits according to a plan of adding redundancy in the presence of failure of any linear amplifier and in increasing or decreasing power level output signals where required.

2. The combiner of claim 1, also including means controlling the dc level of said n linear amplifiers according to said plan of redundancy and output signal level requirements.

3. The combiner of claim 1, wherein said means controls the positioning of said first, second, third and fourth switching circuits to connect individual ones of said plurality of RF links to redirect RF input signal flow to other impedance matching circuits and linear amplifiers in the event of the failure of any one or more amplifier(s).

4. The combiner of claim 1 wherein said linear amplifiers are of substantially the same gain and wherein said means controls the positioning of said first, second, third and fourth switching circuits to connect individual ones of said plurality of RF links to redirect RF signal flow to additional impedance matching circuits and linear amplifiers in the event of a need to increase power output level.

5. The combiner of claim 1 wherein said linear amplifiers are of substantially the same gain, and wherein said means controls the positioning of said first, second, third and fourth switching circuits to connect individual ones of said plurality of RF links to redirect RF signal flow to fewer impedance matching circuits and linear amplifiers in the event of a need to decrease power output level.

6. The combiner of claim 1 wherein said linear amplifiers exhibit a variety of differing gain characteristics, and wherein said means controls the positioning of said first, second, third and fourth switching circuits to connect individual ones of said plurality of RF links to direct RF signal flow to selected impedance matching circuits and linear amplifiers in optimizing the RF power output signal delivered utilizing various numbers of the different gain characteristic amplifiers available.

7. The combiner of claim 2 wherein n equals 3.

8. The combiner of claim 2 wherein n equals 4.

9. A programmable radio frequency (RF) power combiner comprising:

a first terminal providing a radio frequency input signal;

a second terminal providing a radio frequency output signal;

a plurality of linear amplifiers connected between said first and second terminals; and switch means coupling individual ones of said plurality of amplifiers in series connection between said first and second terminals in providing a redundancy of continuing circuit operation upon the failure of any one or more amplifiers, and in providing a controllable level of output signal at said second terminal as gain characteristics of one or more of said amplifiers vary or as different output power signal levels are required;

wherein said switch means includes one n-way RF signal splitter, n first impedance matching circuits coupled to individual outputs of said splitter in providing a series of decreasing impedance ratios of the order 1:1, 1:2 . . . 1:n, n first switching circuits coupling into an input terminal of respective ones of said plurality of amplifiers and n−1 second switching circuits coupled between associated ones of said first impedance matching circuits and said first switching circuits;

wherein said switch means also includes one n-way RF signal combiner, n second impedance matching circuits coupled to individual inputs of said combiner in providing a series of increasing impedance ratios of the order of 1:1, 2:1 . . . n:1, n third switching circuits coupling into an output terminal of respective ones of said plurality of amplifiers, and n−1 fourth switching circuits coupled between associated ones of said second impedance matching circuits and said third switching circuits;

wherein said switch means further includes means controlling the conductivity condition of said first, second, third and fourth switching circuits in accordance with a plan for providing said redundancy of continuing circuit operation and for providing said controllable level of output signal; and with n being a whole integer 2 or greater, equal in number to the number of amplifiers connected between said first and second terminals.

10. The combiner of claim 9, wherein each of said plurality of linear amplifiers initially exhibit substantially the same gain characteristic.

11. The combiner of claim 9, wherein individual ones of said plurality of linear amplifiers initially exhibit gain characteristics which may differ one-from-another.

12. The combiner of claim 9, also including means detecting a variation in performance of one or more of said plurality of linear amplifiers, and actuating said switch means to operation to offset such variation.

13. The combiner of claim 9, also including means monitoring the performance of any one or more of said plurality of linear amplifiers, and actuating said switch means to operation to vary the performance thereof.

* * * * *